(12) United States Patent
Chen et al.

(10) Patent No.: US 9,819,105 B2
(45) Date of Patent: Nov. 14, 2017

(54) CARD CONNECTOR ASSEMBLY HAVING A CARD TRAY WITH A LATCH

(71) Applicant: FOXCONN INTERCONNECT TECHNOLOGY LIMITED, Grand Cayman (KY)

(72) Inventors: Chin-Yu Chen, New Taipei (TW); Hendrikus P. G. Van der Steen, Den Dungen (NL)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/408,727

(22) Filed: Jan. 18, 2017

(65) Prior Publication Data
US 2017/0207558 A1 Jul. 20, 2017

(30) Foreign Application Priority Data
Jan. 19, 2016 (CN) .......................... 2016 1 0032388

(51) Int. Cl.
G06K 13/08 (2006.01)
H01R 12/70 (2011.01)

(52) U.S. Cl.
CPC ..... *H01R 12/7052* (2013.01); *H01R 12/7058* (2013.01)

(58) Field of Classification Search
CPC .............. G06K 13/08; G06K 13/0831; G06K 13/0806; G06K 13/0812; G06K 13/0825; G06K 13/635; H04M 1/0249; H04M 1/0274; H04M 1/21; H01R 13/62938; H01R 13/62955; H01R 13/633; H01R 23/7005

USPC .......................................... 439/159, 157, 160
See application file for complete search history.

(56) References Cited

U.S. PATENT DOCUMENTS

| | | | |
|---|---|---|---|
| 6,330,151 B1 * | 12/2001 | Bates, III | G06K 19/0718 361/679.02 |
| 7,865,210 B2 | 1/2011 | Wang et al. | |
| 9,001,501 B2 | 4/2015 | Takasaki et al. | |
| 9,576,225 B2 * | 2/2017 | Zhang | G06K 13/0831 |

(Continued)

FOREIGN PATENT DOCUMENTS

| | | |
|---|---|---|
| CN | 104332766 | 2/2015 |
| CN | 204156209 | 2/2015 |
| TW | M500376 | 5/2015 |

*Primary Examiner* — Gary Paumen
(74) *Attorney, Agent, or Firm* — Wei Te Chung; Ming Chieh Chang

(57) ABSTRACT

A card connector assembly includes: an electrical connector for being mounted behind an opening in a housing of an electronic device, the electrical connector including a cam groove, a slider, a biasing member, and a cam bar coupled between the cam groove and the slider; and a card tray insertable into the electrical connector through the housing opening for moving the slider from the ejected position to the inserted position; wherein the cam bar has a push portion; the card tray includes a latch, the latch being adapted to be stopped by the electronic device housing when the slider is at the inserted position; and when pushing the card tray to move the slider from the inserted position to the ejected position, the push portion of the cam bar releases the latch for the slider together with the card tray to move to the ejected position.

12 Claims, 19 Drawing Sheets

(56) References Cited

U.S. PATENT DOCUMENTS

| | | | |
|---|---|---|---|
| 2017/0026070 A1* | 1/2017 | Hodroj | H04B 1/3888 |
| 2017/0126858 A1* | 5/2017 | Evans, V | H04L 63/0853 |
| 2017/0126861 A1* | 5/2017 | Evans, V | H04M 1/0249 |
| 2017/0126862 A1* | 5/2017 | Evans, V | H04M 1/0274 |
| 2017/0126870 A1* | 5/2017 | Evans, V | H04M 1/21 |

* cited by examiner

CARD CONNECTOR ASSEMBLY HAVING A CARD TRAY WITH A LATCH

BACKGROUND OF THE INVENTION

1. Field of the Invention

The present invention relates to a card connector assembly having a card tray with a latch which cooperates with a housing of an electronic device to determine a stopping position of the tray.

2. Description of Related Arts

U.S. Pat. No. 7,865,210, issued on Jan. 4, 2011, discloses an ejectable component assembly for passing a removable card tray through an opening in a housing of an electronic device and aligning the card tray with a circuit board within the electronic device housing. The assembly comprises: a connector for retaining the card tray when the card tray is inserted in a first direction through the opening; and an ejector coupled to the electronic device housing for ejecting the card tray from the connector in a second direction opposite to the first direction. The ejector comprises: a base that pivots about a portion of the housing; an extension arm coupled to the base; a user contact plate coupled to a first portion of the extension arm; and a card tray contact plate coupled to a second portion of the extension arm.

U.S. Pat. No. 9,001,501, issued on Apr. 7, 2015, discloses a card tray and a card connector for receiving the card tray. The card connector includes a housing, a shell covering the housing, and a tray guiding mechanism having a sliding member. A cam groove serving as a heart-shaped cam is formed on the upper face of the sliding member, and the free end of a slender pin member serving as a fixed cam member engages the cam groove. The other end of the pin member is fixed pivotally to the rear end portion of the housing as the fixed end. The pin member and the cam groove work together to perform a push/push operation on the sliding member moving along with the card tray. A biasing member or coil spring is accommodated inside the tray guiding mechanism to provide biasing force in a compressed state which biases the sliding member towards the rear end portion, i.e., in the ejection direction of the card tray.

SUMMARY OF THE INVENTION

A card connector assembly comprises: an electrical connector for being mounted behind an opening in a housing of an electronic device, the electrical connector including a cam groove, a slider, a biasing member exerting a force on the slider, and a cam bar coupled between the cam groove and the slider to effectuate a movement of the slider between an inserted position and an ejected position under the force of the biasing member; and a card tray insertable into the electrical connector through the housing opening of the electronic device for moving the slider from the ejected position to the inserted position; wherein the cam bar has a push portion; the card tray includes a latch, the latch being adapted to be stopped by the electronic device housing when the slider is at the inserted position; and when pushing the card tray to move the slider from the inserted position to the ejected position, the push portion of the cam bar releases the latch for the slider together with the card tray to move to the ejected position.

The latch determines a proper position of the card tray with respect to the electronic device housing opening while conveniently utilizing a push/push operation of the slider.

DETAILED DESCRIPTION OF THE PREFERRED EMBODIMENT

Figure 1:
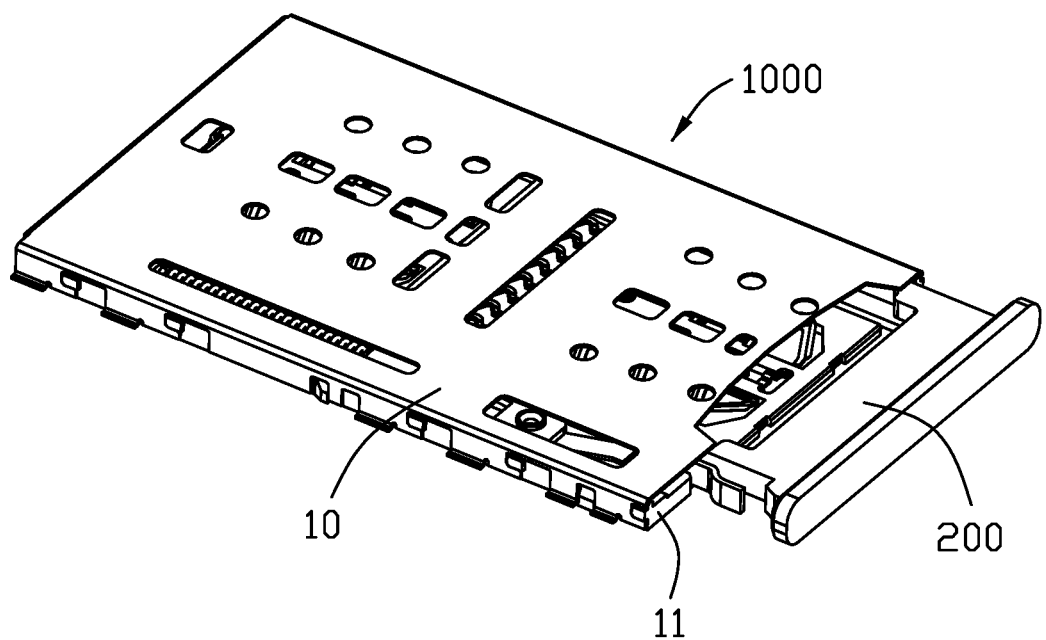
FIG. 1 is a perspective view of a card connector assembly in accordance with a first embodiment of the present invention.
Figure 2:
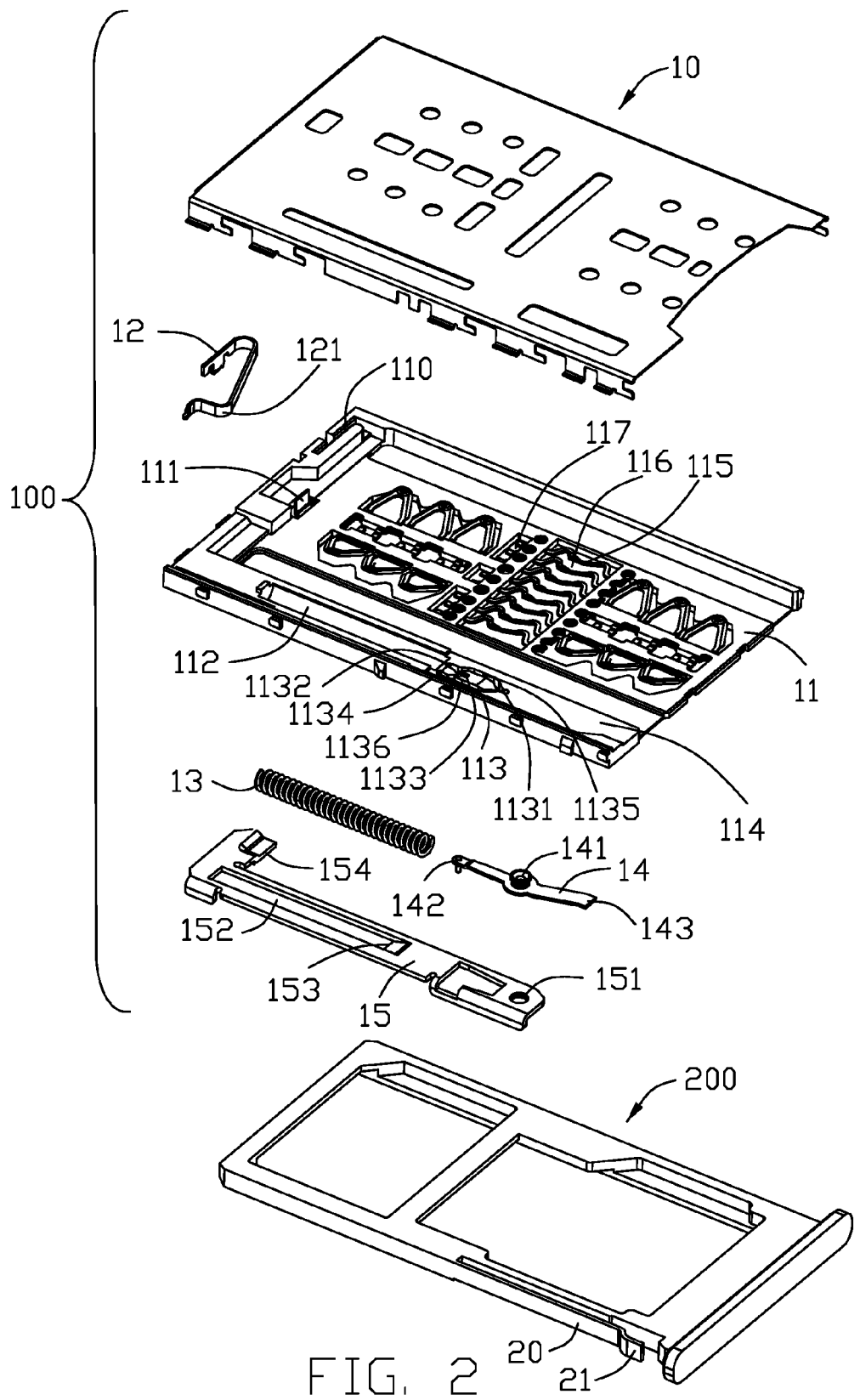
FIG. 2 is an exploded view of the card connector assembly.

Referring to FIGS. 1 to 7, a card connector assembly 1000 comprises an electrical connector 100 for being mounted behind an opening in a housing of an electronic device, generally designated as 300, and a card tray 200 insertable into the electrical connector 100 through the housing opening of the electronic device 300.

The electrical connector 100 includes a base 11 and a shell 10. A switch contact 12 having a contact portion 121 is secured in a slot 110 of the base 11 for cooperating with a detect contact 111. The base 11 includes a channel 112 having an abutment end, a cam groove 113, and a receiving area 114. The cam groove 113 serving as a heart-shaped cam includes a first path 1135 and a second path 1136 in connection with each other to define four positions 1131, 1132, 1133, 1134. The electrical connector 100 also includes a slider 15, a biasing member 13 such as a coil spring in the channel 112 for exerting a force on the slider 15, and a cam bar 14 coupled between the cam groove 113 and the slider 15 to effectuate a movement of the slider 15 between an inserted position and an ejected position under the force of the biasing member 13, as will be further detailed later. The cam bar 14 includes a pin end 142 engaging the cam groove 113, a pivot portion 141, and a push portion 143. The slider 15 includes a pivot hole 151, a receiving slot 152, and an abutting portion 154. The biasing member 13 is accommodated in the channel 112 and the receiving slot 152 with one end thereof engaging an end 153 of the slider 15 and the other end bearing against the abutment end of the channel 112. The pivot portion 141 is pivoted to the pivot hole 151 and the cam bar 14 is placed on the receiving area 114. The cam bar 14 and the cam groove 113 work together in a known manner to perform a so-called push/push operation on the slider 15 moving along with the card tray 200.

In a first embodiment, the card tray 200 includes an integrally formed latch 20. The latch 20 is flexible and has an abutting end 21. A gap exists between the latch 20 and remaining portion of the card tray 200 so that the latch 20 is deflectable by the push portion 143 of the cam bar 14 toward the remaining portion of the card tray.

Figure 3:
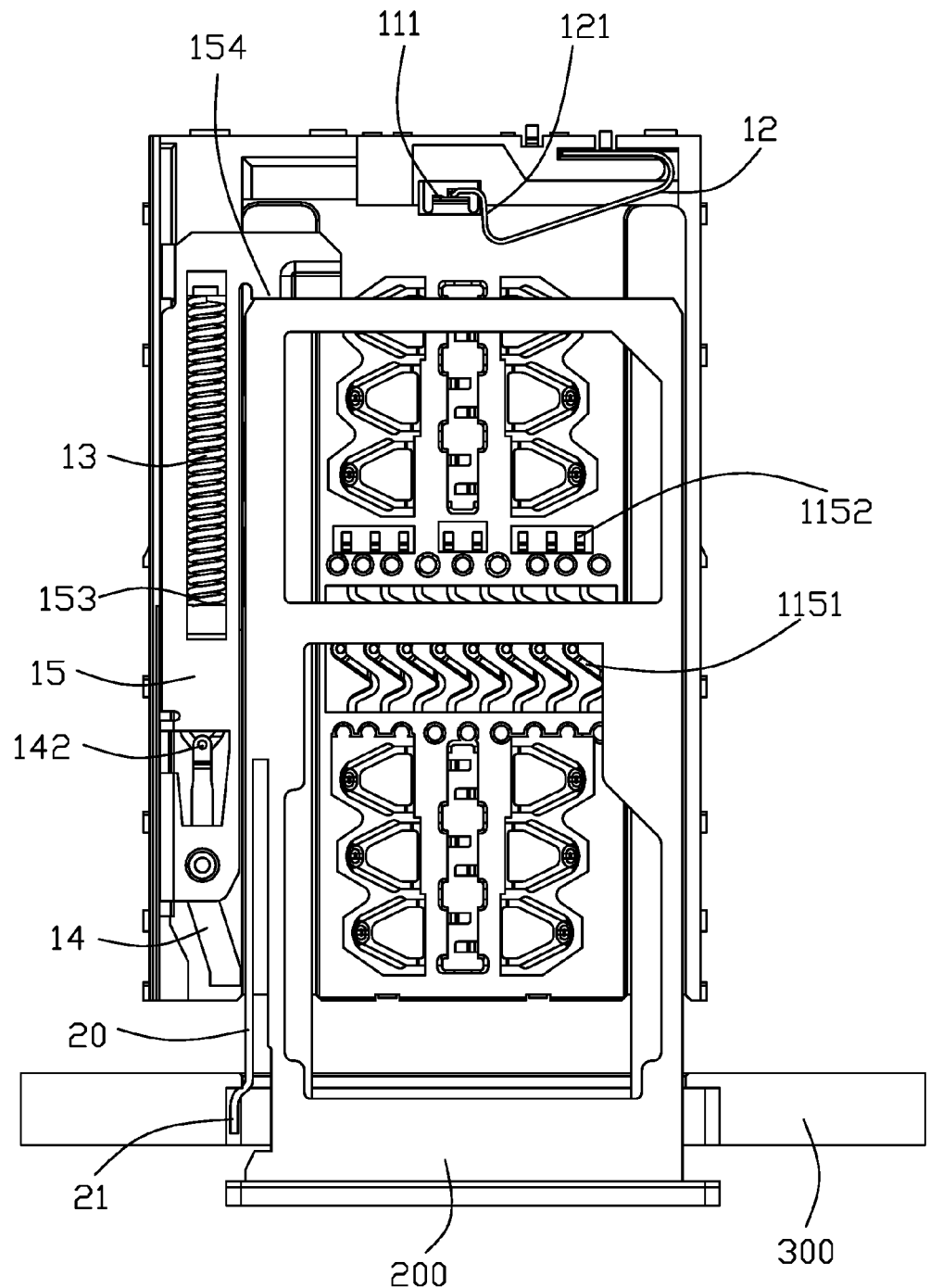
FIG. 3 shows an initial/rejected position of a card tray of the card connector assembly.

Before inserting the card tray 200, the pin end 142 is at the first position 1131 for the cam groove 113, i.e., the slider 15 is at an ejected position, as shown in FIG. 3. The switch contact 12 is designed as normally closed.

Figure 4:
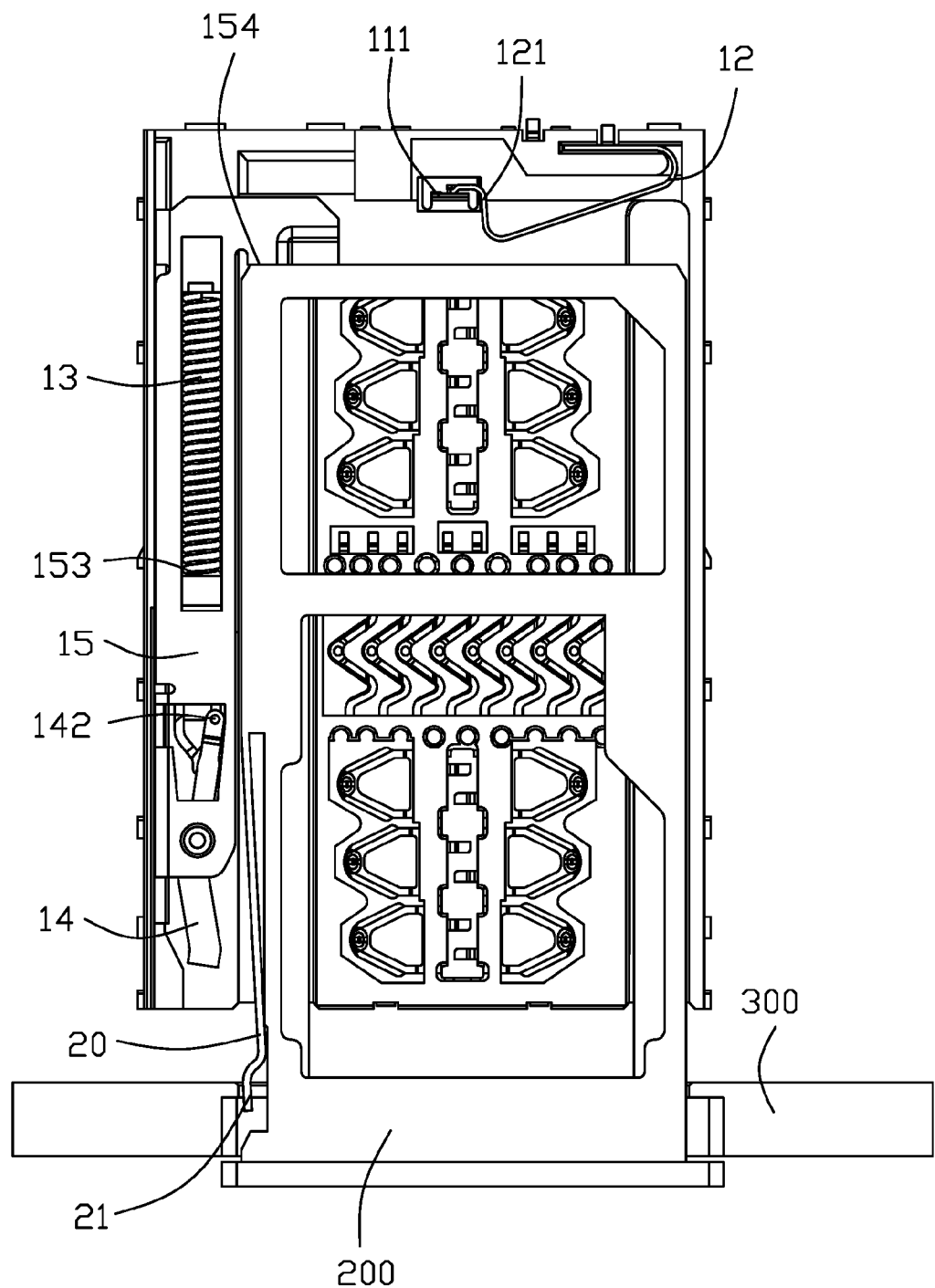
FIG. 4 shows a subsequent position of the card tray in FIG. 3 pushed in an insertion direction.
Figure 5:
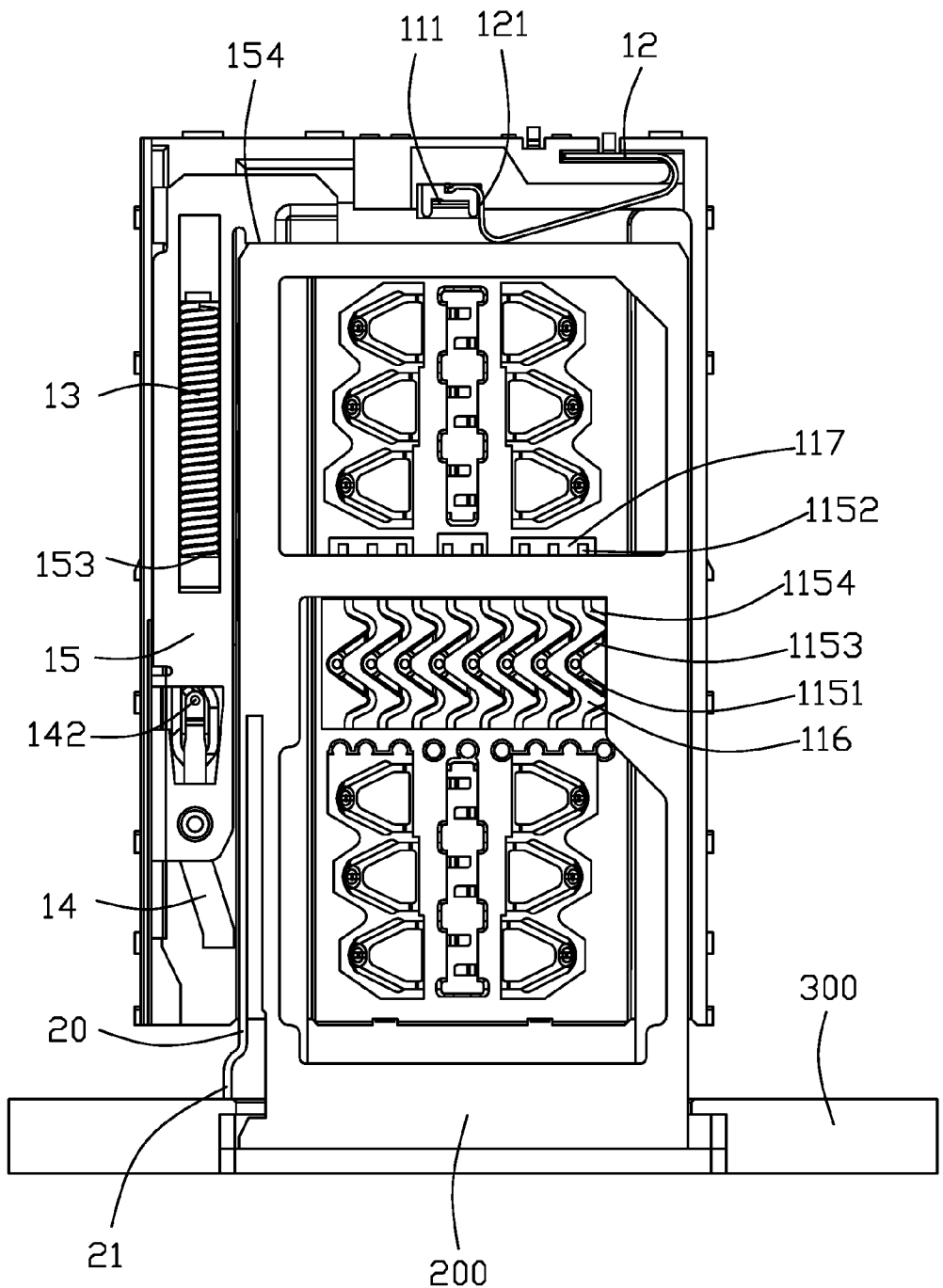
FIG. 5 shows a subsequent inserted position of the card tray in FIG. 3.

When pushing or inserting the card tray 200 into the electrical connector 100 though an opening of the electronic device housing 300, the slider 15 moves together with the card tray 15 while compressing the biasing member 13. The pin end 142 follows the first path 1135. The latch 20 is able to deflect, as shown in FIG. 4, to then pass over the housing opening. When the pin end 142 arrives at the second position 1132 and a pushing force is lessened or released, the pin end 142 will fall back to the third position 1133 under a returning force of the biasing member 13. At the same time, the slider 15 is at an inserted position and the abutting end 21 of the latch 20 is stopped by the electronic device housing 300, as shown in FIG. 5.

Figure 6:
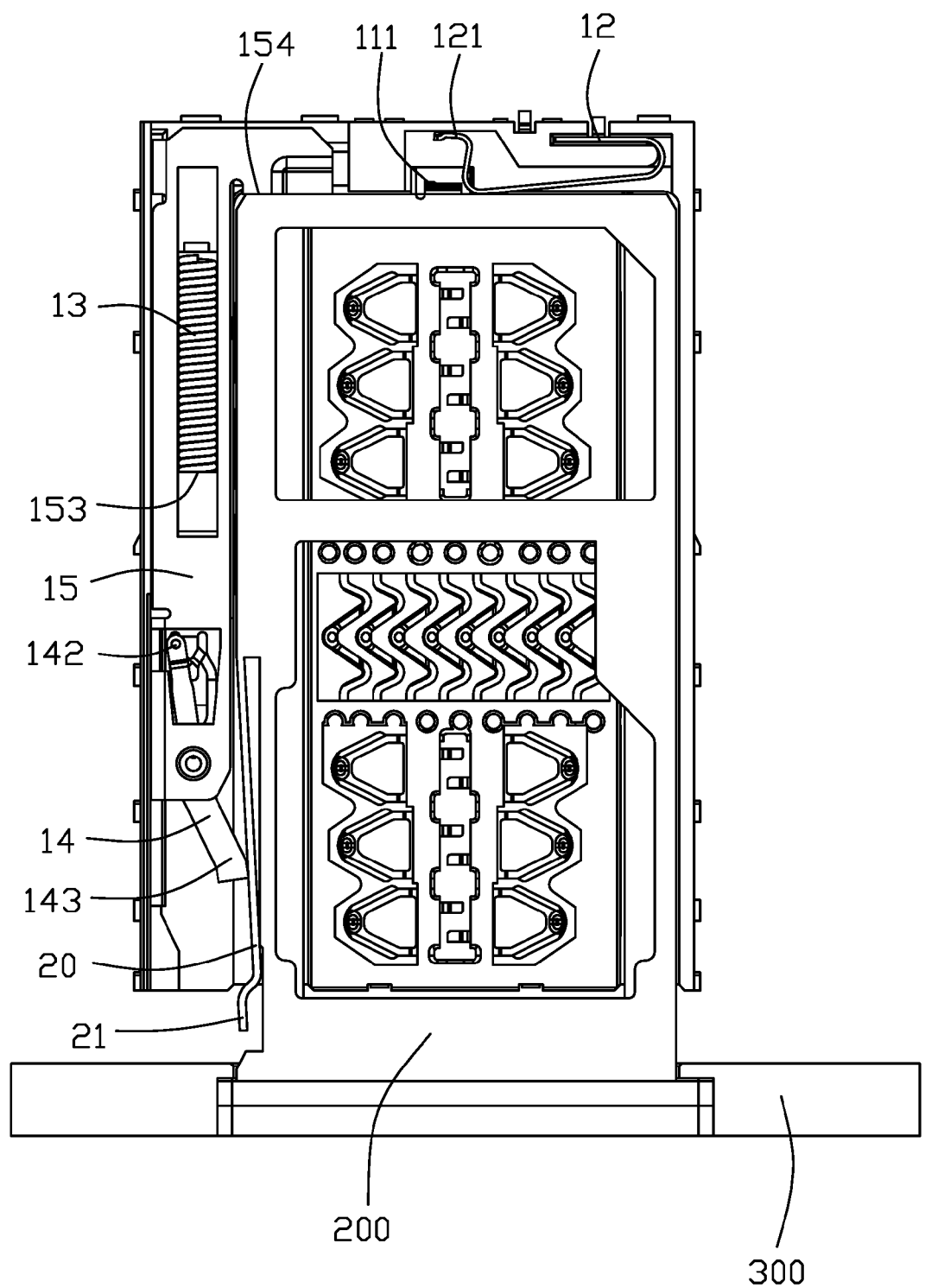
FIG. 6 shows a subsequent position of the card tray in FIG. 5 pushed in an insertion direction.
Figure 7:
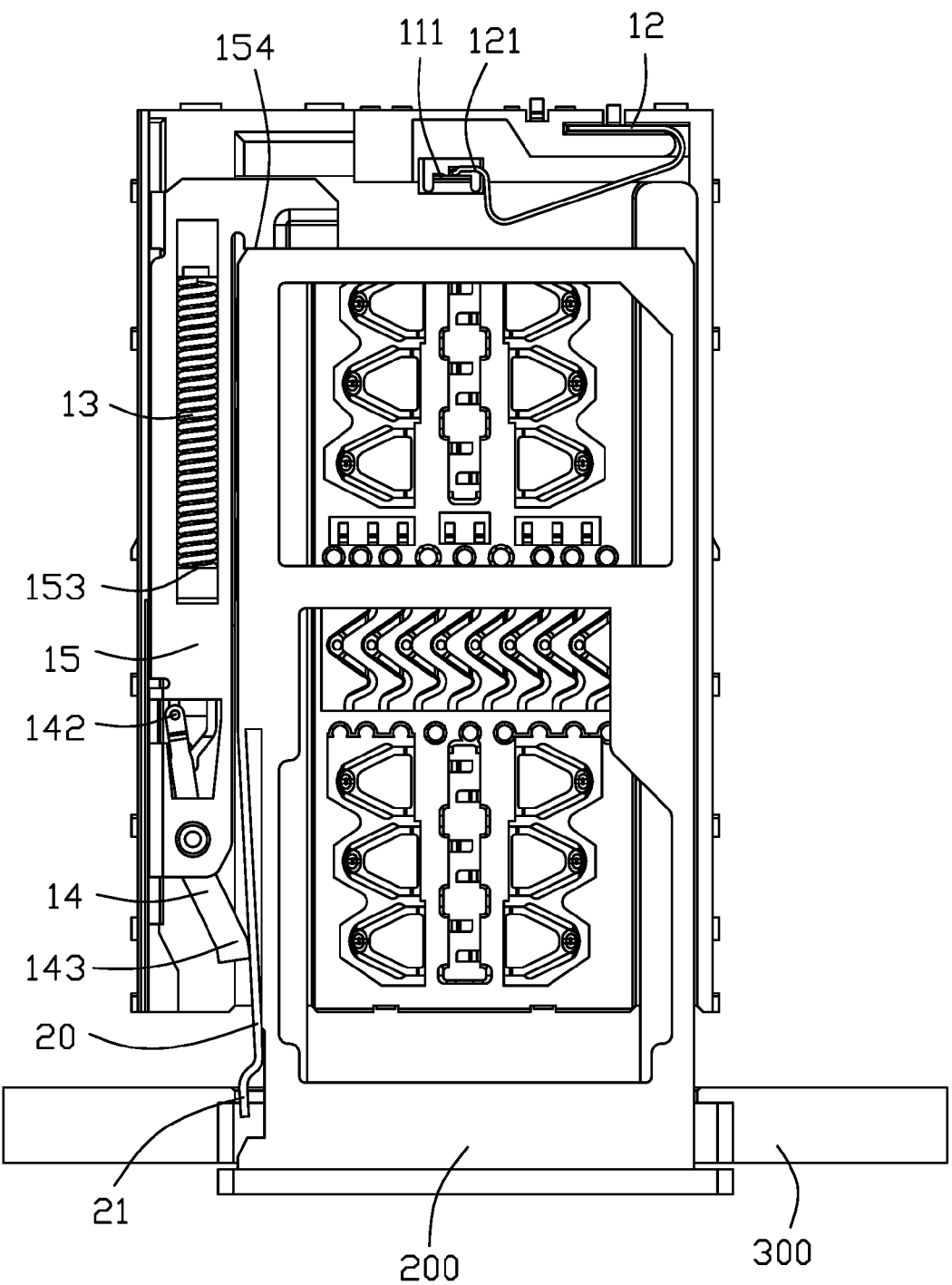
FIG. 7 shows a subsequent position of the card tray in FIG. 6 when a pushing force is lessened.
Figure 8:
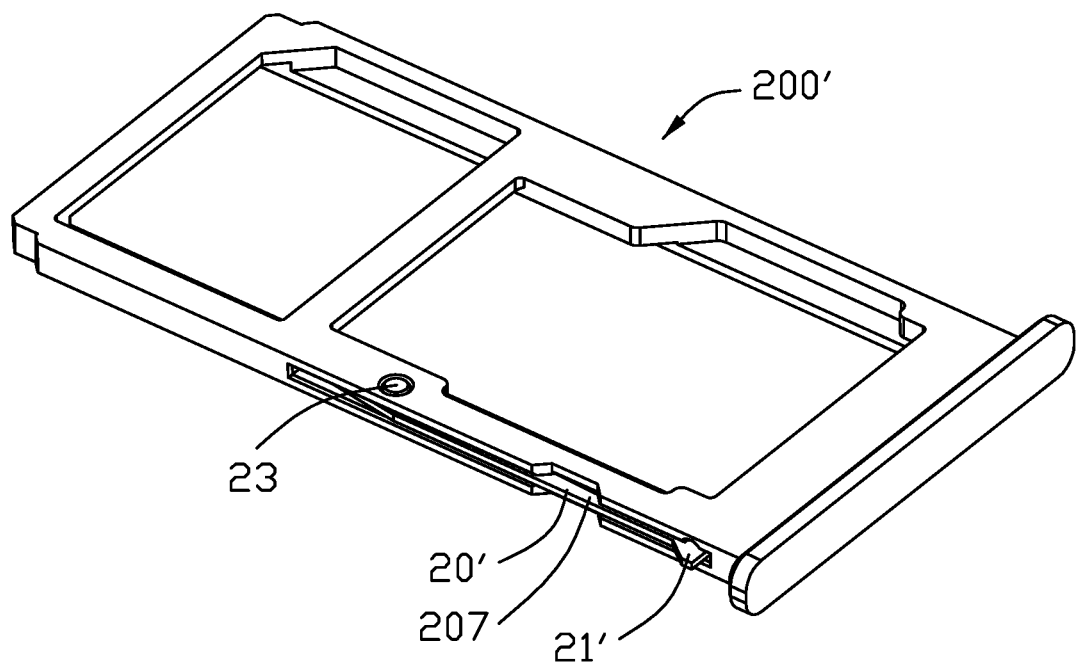
FIG. 8 is a perspective view of a card tray in accordance with a second embodiment of the present invention.
Figure 9:
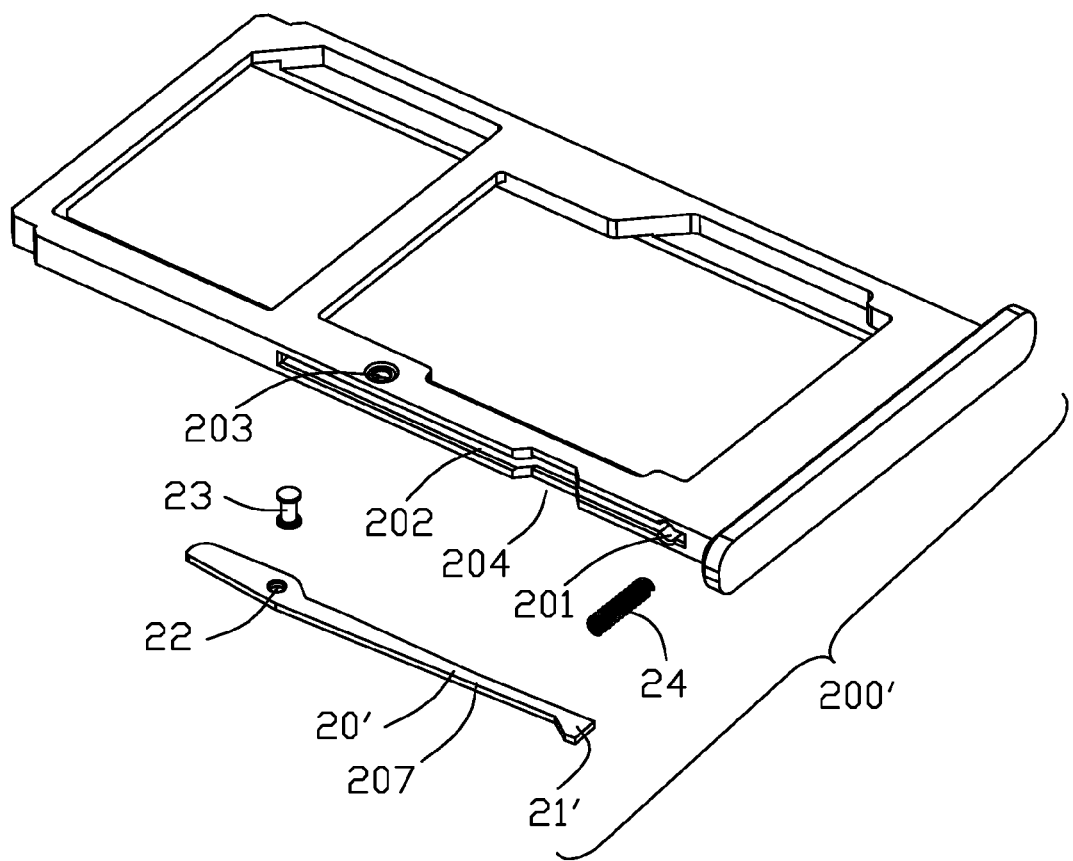
FIG. 9 is an exploded view of the card tray in FIG. 8.
Figure 10:
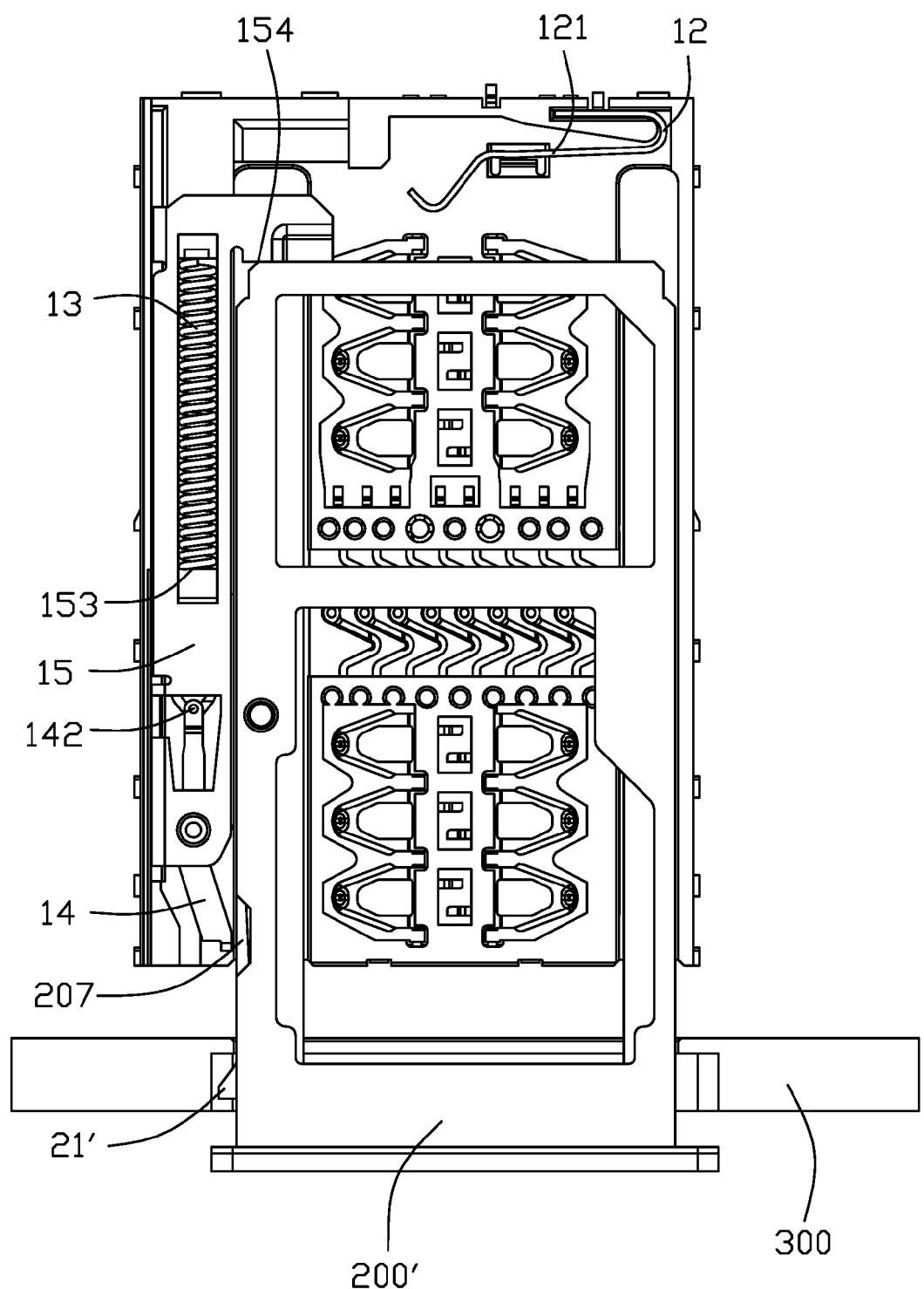
FIG. 10 shows a position of the card tray in FIG. 8 similar to FIG. 3.
Figure 11:
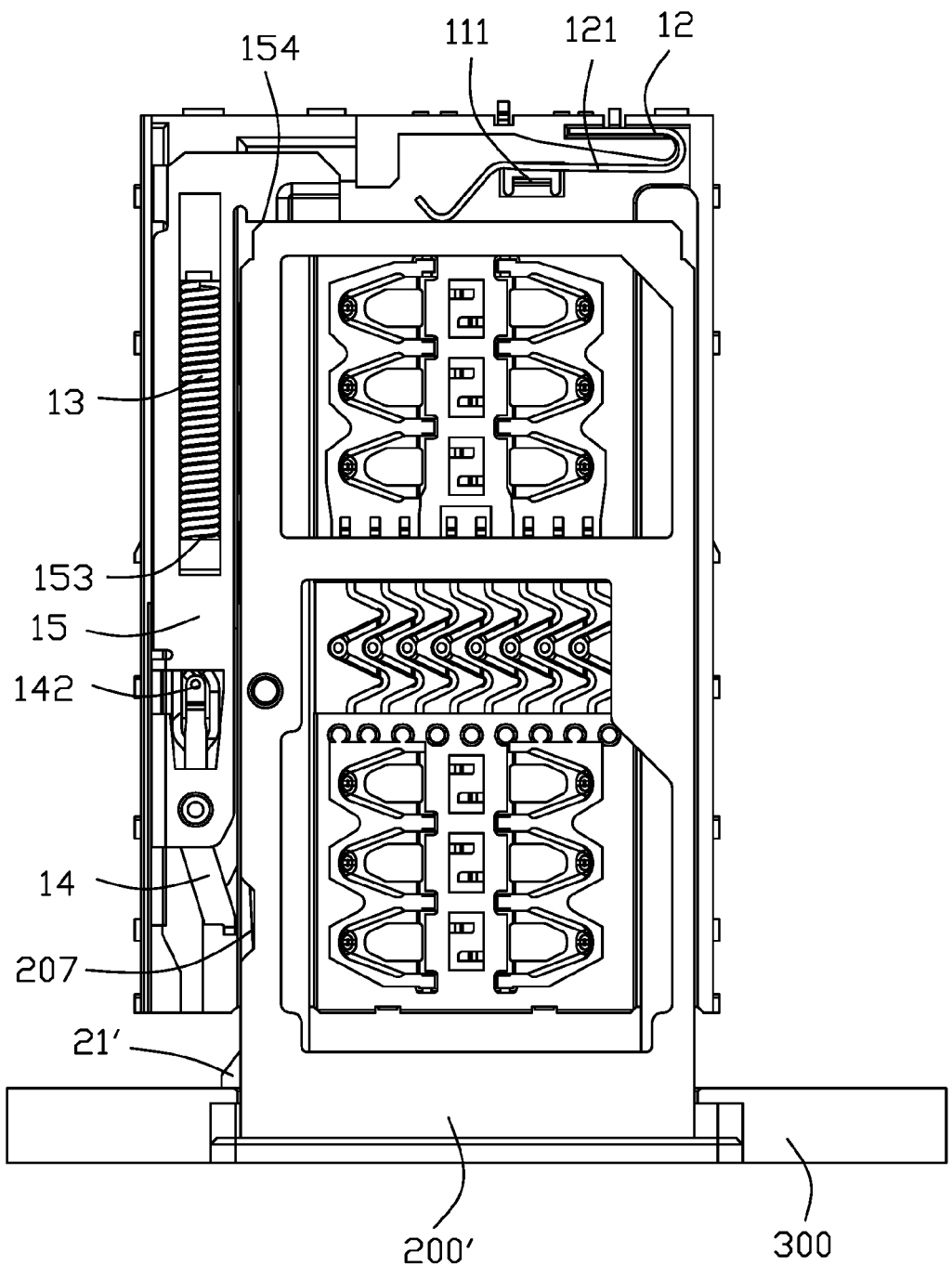
FIG. 11 shows an inserted position of the card tray in FIG. 8 similar to FIG. 5.
Figure 12:
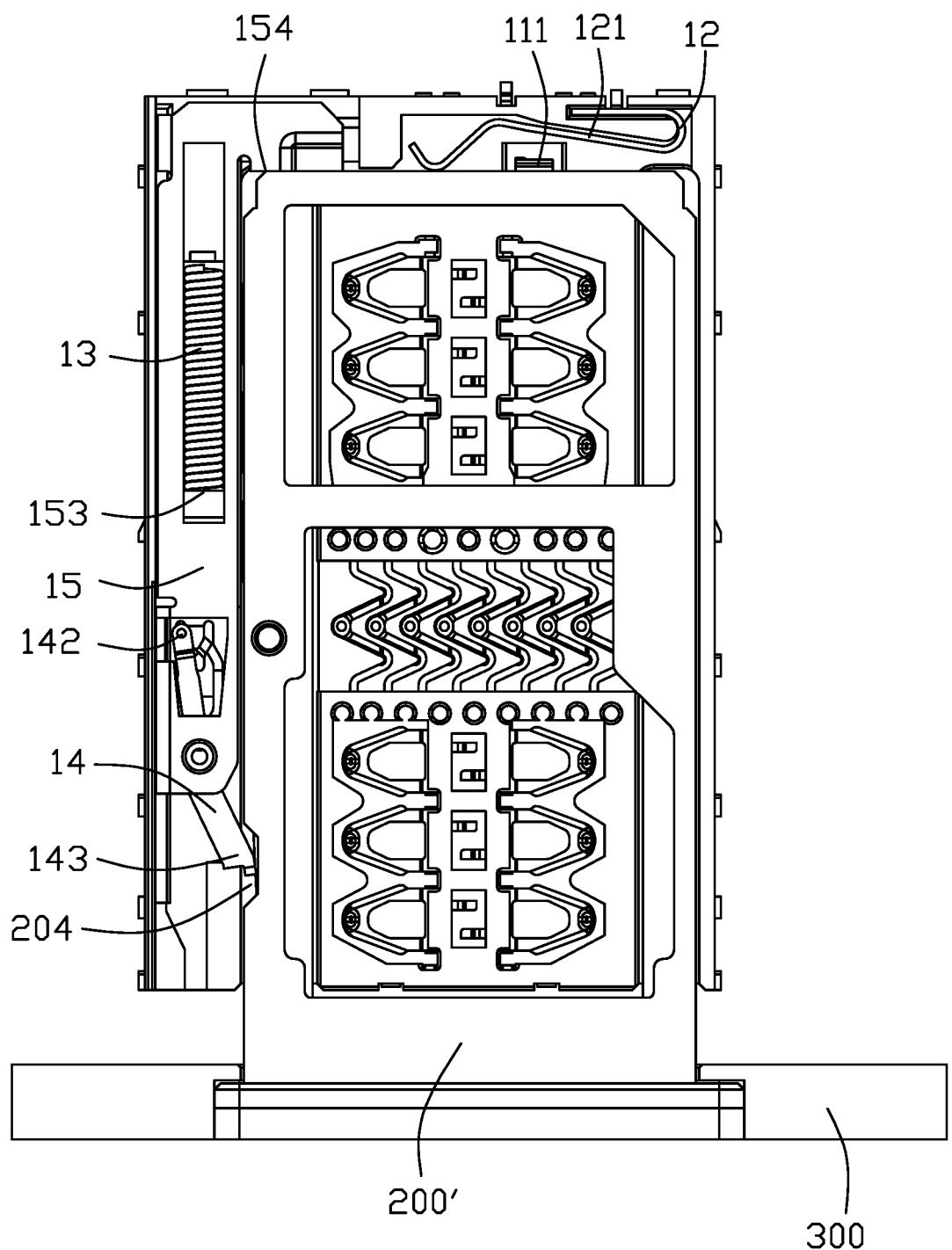
FIG. 12 shows a position of the card tray in FIG. 8 similar to FIG. 6.
Figure 13:
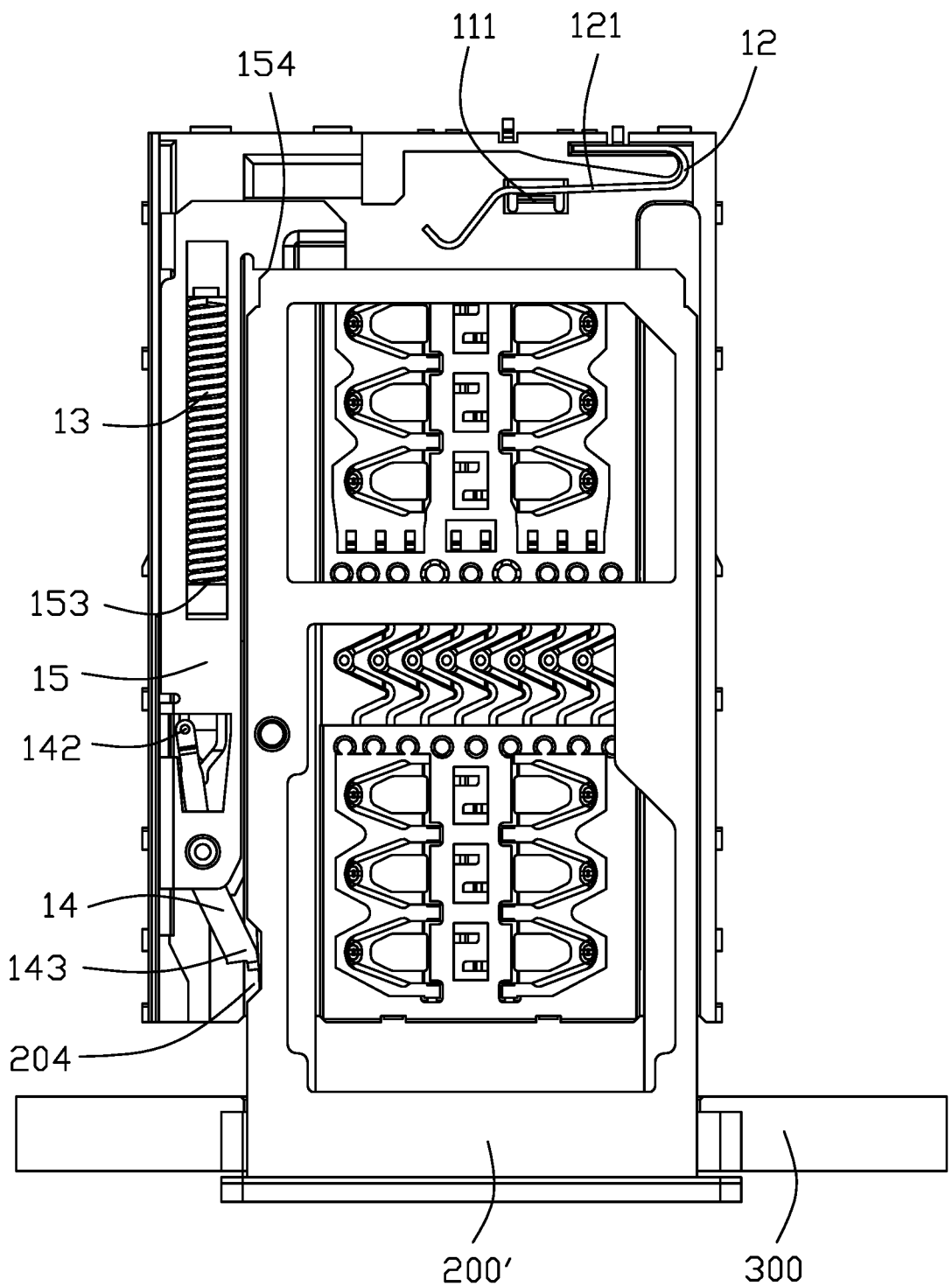
FIG. 13 shows a position of the card tray in FIG. 8 similar to FIG. 7.
Figure 14:
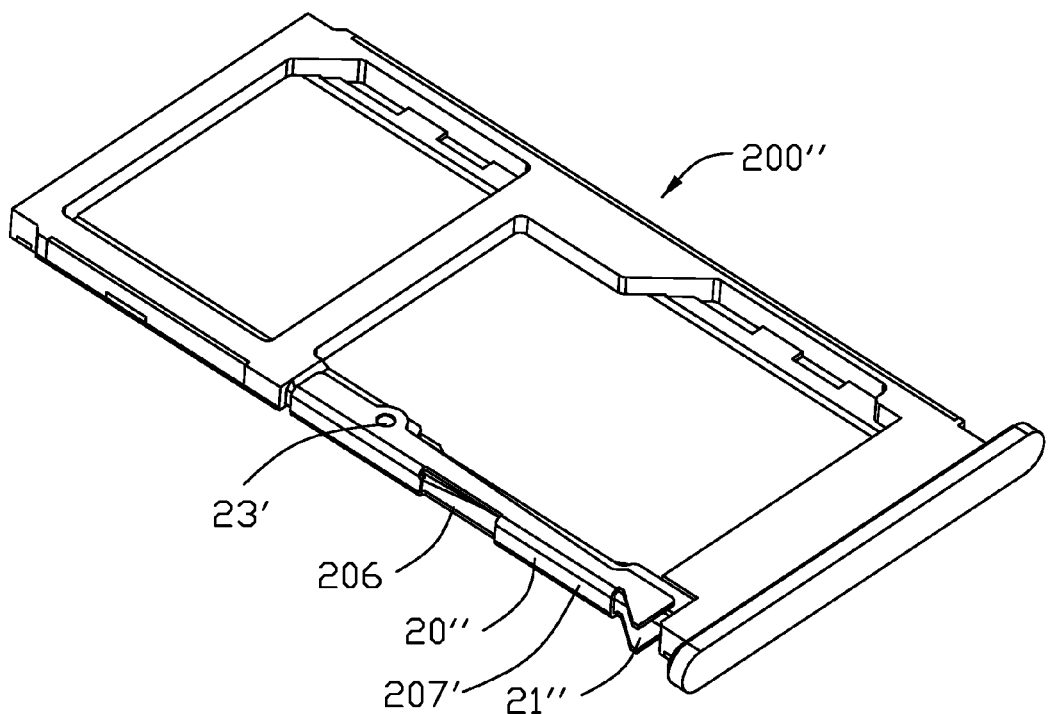
FIG. 14 is a perspective view of a card tray in accordance with a third embodiment of the present invention.
Figure 15:
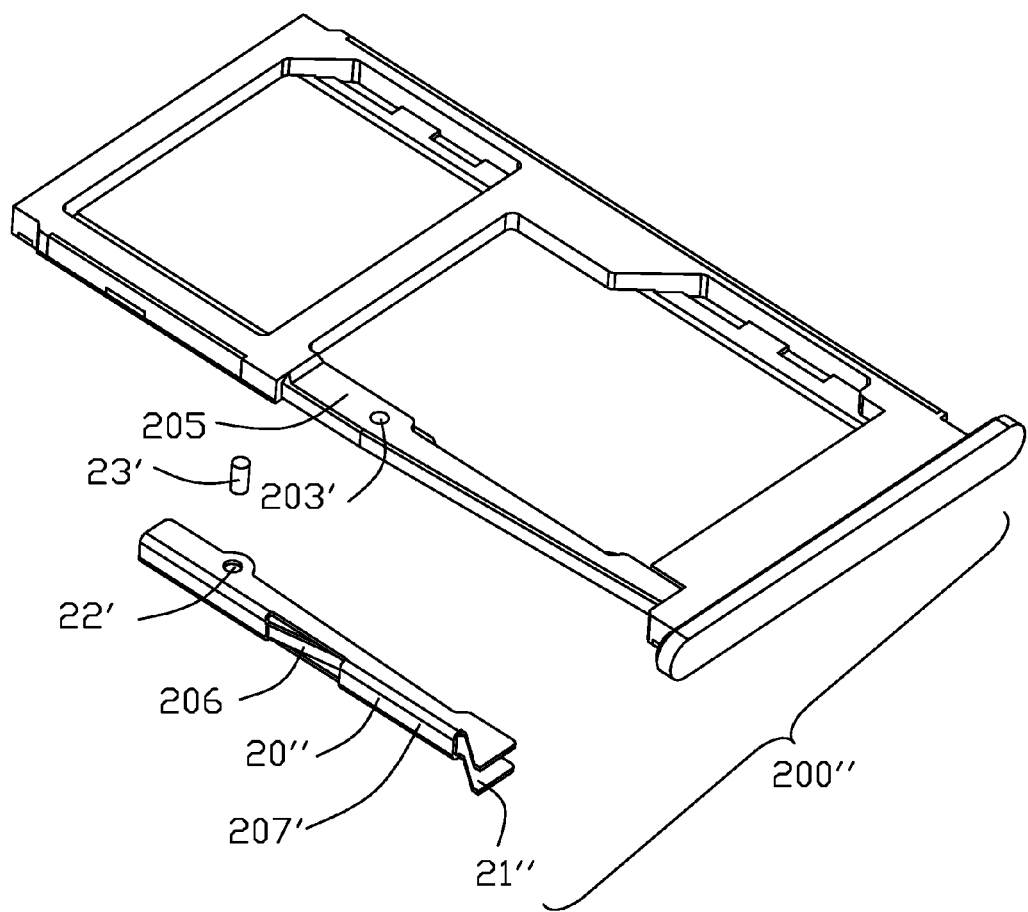
FIG. 15 is an exploded view of the card tray in FIG. 14.
Figure 16:
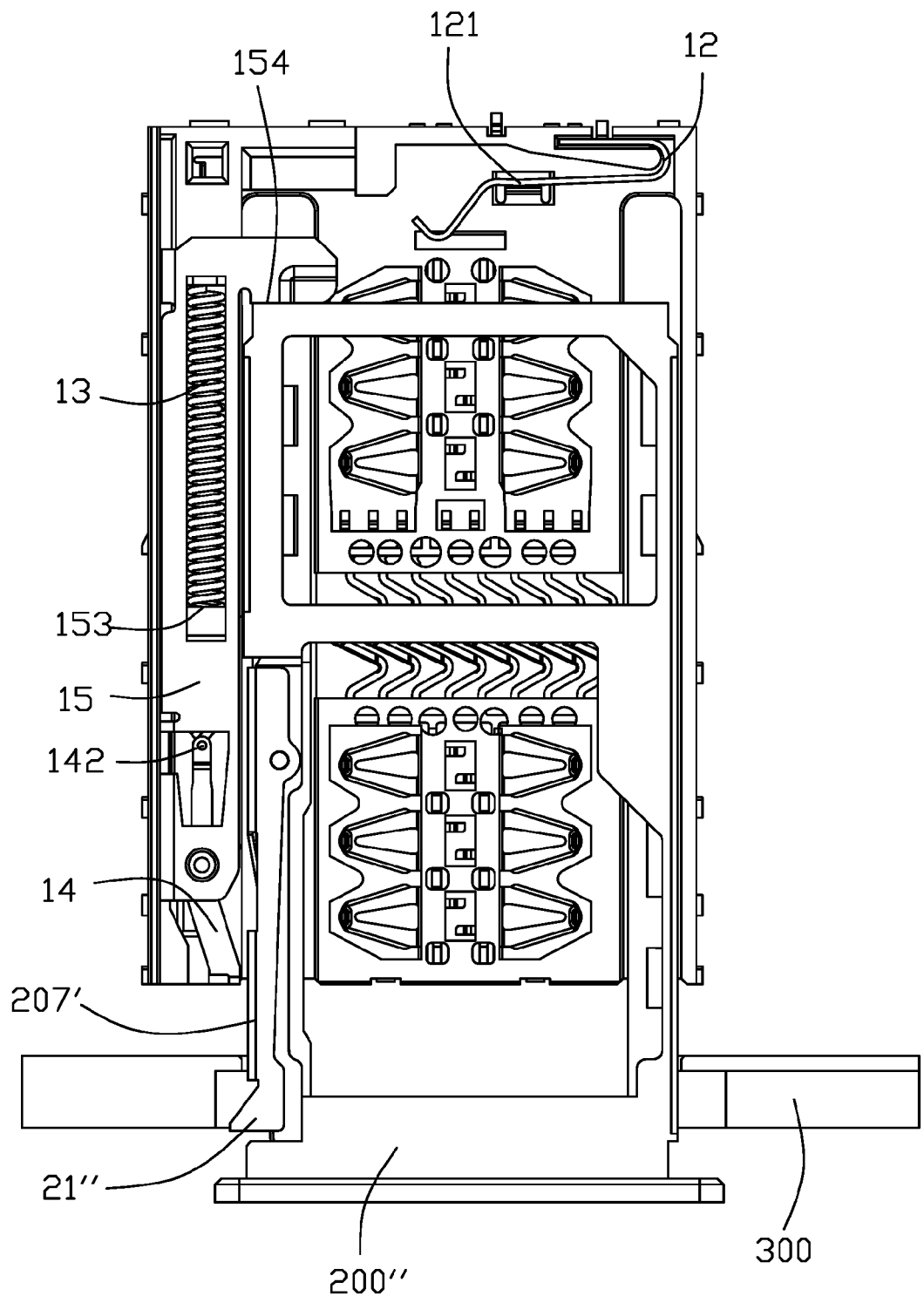
FIG. 16 shows a position of the card tray in FIG. 14 similar to FIG. 3.
Figure 17:
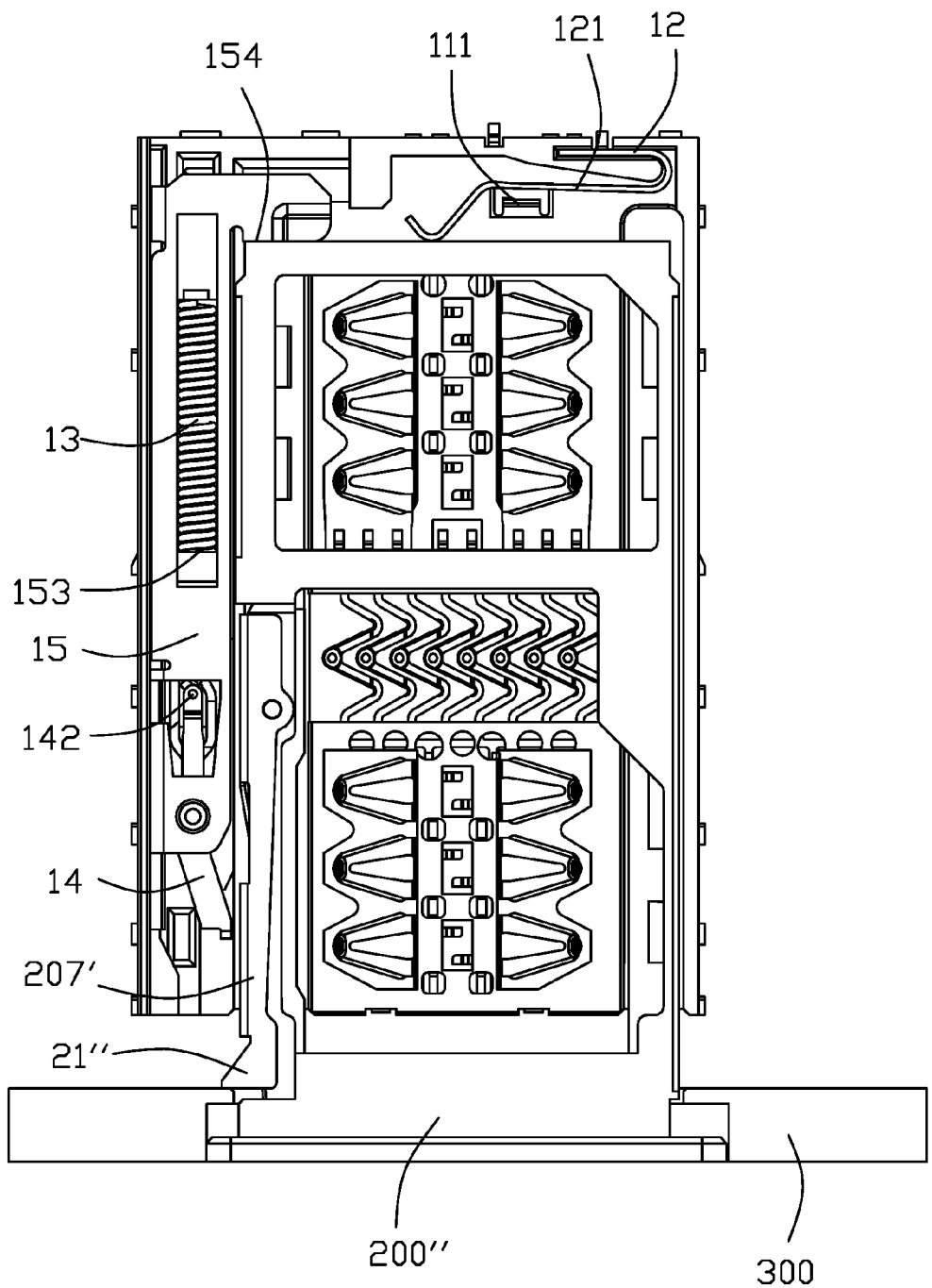
FIG. 17 shows an inserted position of the card tray in FIG. 14 similar to FIG. 5.
Figure 18:
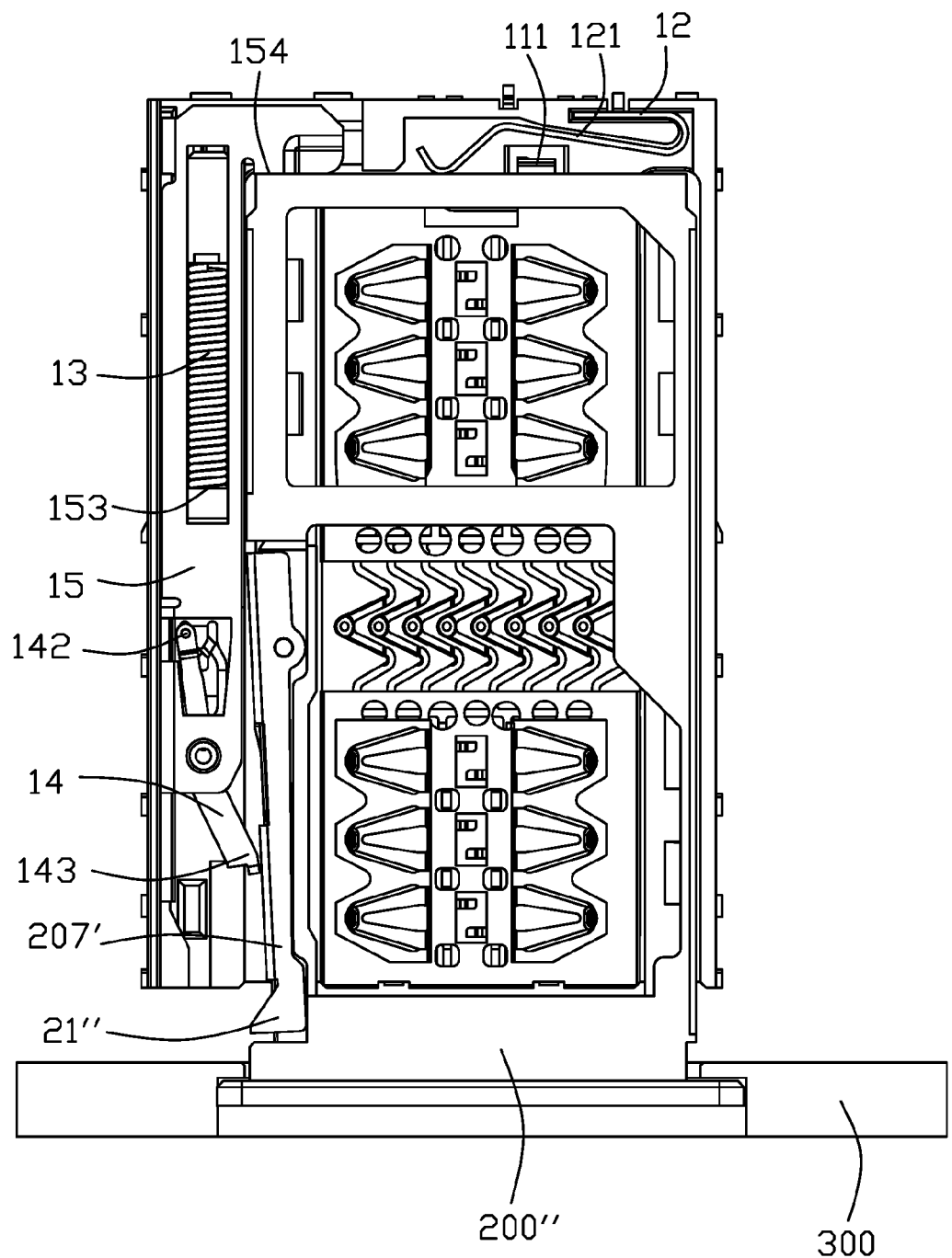
FIG. 18 shows a position of the card tray in FIG. 14 similar to FIG. 6.
Figure 19:
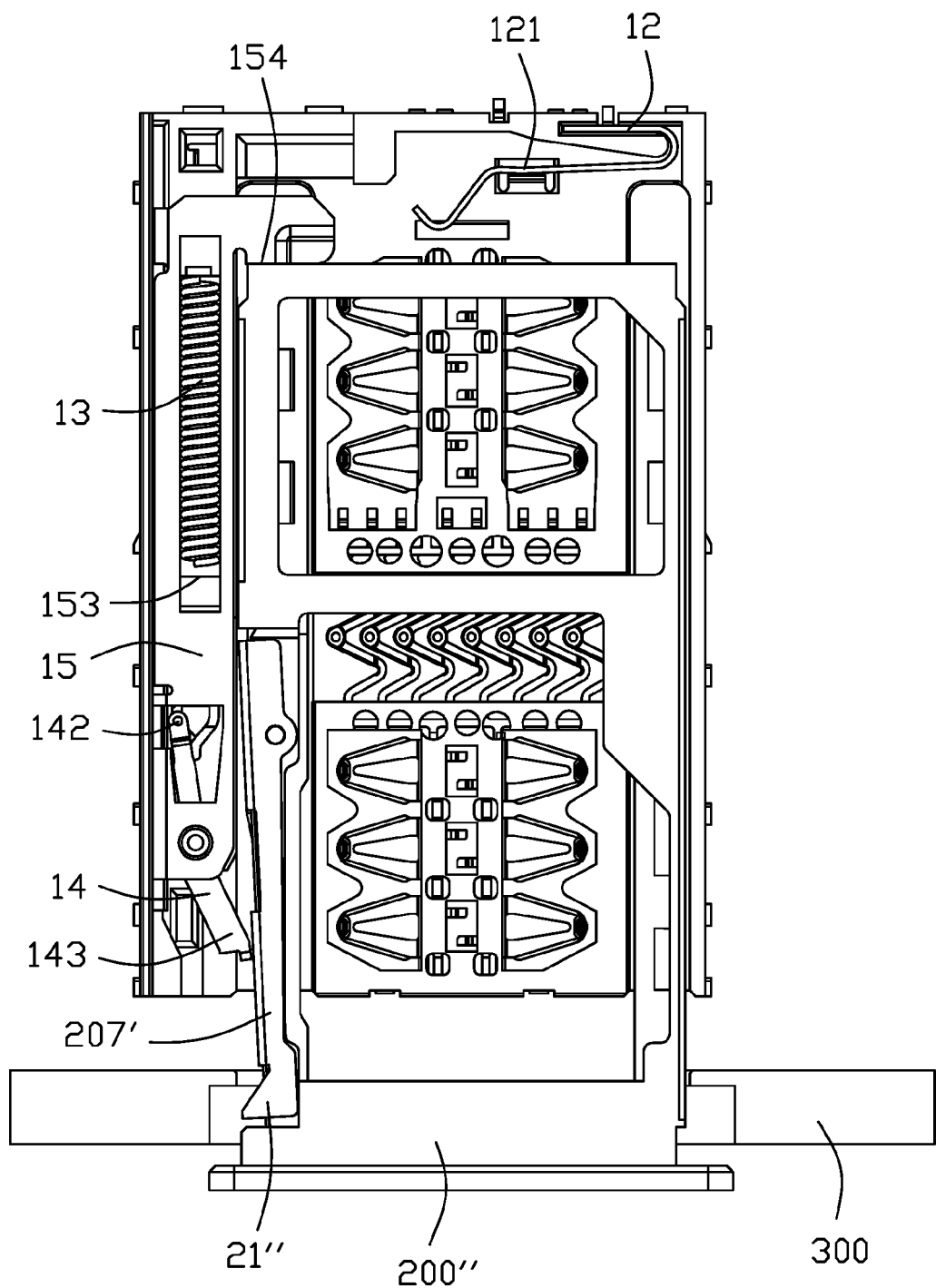
FIG. 19 shows a position of the card tray in FIG. 14 similar to FIG. 7.

To eject the card tray 200, a pushing force is applied. The card tray 200 will follow the second path 1136 to arrive at the fourth position 1134, as shown in FIG. 6. Since the second path 1136 and/or the fourth position 1134 is located at a far side (left-hand side of the drawing sheet), the push portion 143 of the cam bar 14 moves the latch 20 toward the card tray 200 to release the latch 20. When a pushing force is lessened or removed, the slider together with the card tray will move toward the ejected position (FIG. 3), as shown in FIG. 7, under a returning force of the biasing member 13. Notably, the card tray 200 is moved between the inner position and an outer position in response to the slider between the inserted position and the ejected position.

FIGS. 8-13 show a card tray 200' according to a second embodiment. The card tray 200' includes a frame and a latch 20' pivoted to the frame. Specifically, the frame includes a hole 203, a slot 202, and a notch 204. The latch 20' includes a body 207, a hole 22, and an abutting end 21'. The latch 20' is pivoted to the frame of the card tray by riveting a pin 23 in the holes 203 and 22. A hole 201 receives a spring 24 which bears against the latch 20' so that the latch 20' can be flexible like the latch 20 in the first embodiment. The operation of the latch 20' and therefore of the card tray 200' with respect to the electrical connector 100 is same as that of the latch 20 and the card tray 200. Therefore, FIGS. 10-13 are essentially same as FIGS. 3, 5, 6, and 7, respectively, and their descriptions will not be repeated here.

FIGS. 14-19 show a card tray 200" according to a third embodiment. The card tray 200" includes a frame and a latch 20" pivoted to the frame. Specifically, the frame includes a hole 203' and a receiving area 205 on two opposite surfaces thereof. The latch 20" includes a body 207', a hole 22', a resilient piece 206, and an abutting end 21". The latch 20" is pivoted to the frame of the card tray by riveting a pin 23' in the holes 203' and 22'. With the resilient piece 206, the latch 20" is flexible like the latch 20 in the first embodiment. The operation of the latch 20" and therefore of the card tray 200" as applied to the electrical connector 100 is same as that of the latch 20 and the card tray 200. Therefore, FIGS. 16-19 are essentially same as FIGS. 3, 5, 6, and 7, respectively, and their descriptions will not be repeated here. Notably, in the embodiments the latch 20, 20' and 20" adapted to be actuated by the push portion of the cam bar, is mounted to the frame of the card tray, in a deflectable manner, with the abutting end engaged/disengaged with/from the electronic device housing 300. Anyhow, in another embodiment, the latch may be pivotally mounted to the electronic device housing 300 with the abutting end engaged/disengaged with/from the notch 204 of the card tray 200. Anyhow, the former is superior to the latter.

What is claimed is:

1. A card connector assembly comprising:
    an electrical connector for being mounted behind an opening in a housing of an electronic device, the electrical connector including a cam groove, a slider, a biasing member exerting a force on the slider, and a cam bar coupled between the cam groove and the slider to effectuate a movement of the slider between an inserted position and an ejected position under the force of the biasing member; and
    a card tray insertable into the electrical connector through the housing opening of the electronic device for moving the slider from the ejected position to the inserted position; wherein
    the cam bar has a push portion;
    the card tray includes a latch, the latch being adapted to be stopped by the electronic device housing when the slider is at the inserted position; and
    when pushing the card tray to move the slider from the inserted position to the ejected position, the push portion of the cam bar releases the latch for the slider together with the card tray to move to the ejected position.

2. The card connector assembly as claimed in claim 1, wherein the latch is integrally formed on the tray.

3. The card connector assembly as claimed in claim 1, wherein the card tray comprises a frame, and the latch is pivoted to the frame.

4. A card connector assembly comprising:
    an electrical connector for being mounted behind an opening in a housing of an electronic device, the electrical connector including a heart-shaped cam groove, a slider, a biasing member exerting a force on the slider, and a cam bar coupled between the cam groove and the slider to effectuate a movement of the slider between an inserted position and an ejected position under the force of the biasing member, said cam bar including a push portion; and
    a card tray insertable into the electrical connector through the housing opening of the electronic device for movable between an inner position and an outer position in response to the inserted position and the ejected position of the slider;
    a latch mounted upon one of said housing and said card tray in a deflectable manner, and adapted to be actuated by the push portion; and
    when the card tray is located at the inner position in response to the inserted position of the slider, an interaction between the push portion of the cam bar and the latch makes the latch engaged with housing for securely retaining the card tray in the housing; when the card tray is moved from the inner position to the outer position in response to the slider from the inserted position to the ejected position, the interaction between the push portion of the cam bar and the latch makes the latch disengaged from the housing for allowing the card tray to be withdrawn from the housing.

5. The card connector assembly as claimed in claim 4, wherein the latch is mounted upon the card tray.

6. The card connector assembly as claimed in claim 5, wherein said latch is integrally formed with card tray.

7. The card connector assembly as claimed in claim 4, wherein the cam bar pivotally mounted upon the slider.

8. The card connector assembly as claimed in claim 4, wherein the cam bar includes a pin end movably engaged within the cam groove, said pin end and said push portion respectively located at two opposite ends of the cam bar.

9. The card connector assembly as claimed in claim 4, wherein said latch is configured with a cantilevered manner rather than a pivotal manner.

10. The card connector assembly as claimed in claim 4, wherein said latch is in a relaxed manner when said slider is in the inserted position.

11. The card connector assembly as claimed in claim 10, wherein said latch is in a deflected manner when the slider is moved between the inserted position and the ejected position.

12. The card connector assembly as claimed in claim 11, wherein said latch is in a relaxed manner when said slider is in the ejected position.

* * * * *